(12) United States Patent
Zeng

(10) Patent No.: US 12,396,236 B1
(45) Date of Patent: Aug. 19, 2025

(54) HIGH-VOLTAGE ELECTROSTATIC DISCHARGE DEVICE

(71) Applicant: GlobalFoundries Singapore Pte. Ltd., Singapore (SG)

(72) Inventor: Jie Zeng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/643,628

(22) Filed: Apr. 23, 2024

(51) Int. Cl.
H10D 64/00 (2025.01)
H10D 8/00 (2025.01)
H10D 8/01 (2025.01)
H10D 62/10 (2025.01)

(52) U.S. Cl.
CPC ............ *H10D 64/112* (2025.01); *H10D 8/00* (2025.01); *H10D 8/01* (2025.01); *H10D 62/115* (2025.01)

(58) Field of Classification Search
CPC ............... H01L 29/404; H01L 29/0649; H01L 29/6609; H01L 29/861; H10D 64/112; H10D 8/00; H10D 8/01; H10D 62/115
USPC ........................................................ 257/488
See application file for complete search history.

(56) References Cited

U.S. PATENT DOCUMENTS

| 5,011,784 | A | 4/1991 | Ratnakumar |
| 6,472,286 | B1 | 10/2002 | Yu |
| 7,968,936 | B2 | 6/2011 | Denison et al. |
| 8,878,283 | B2 | 11/2014 | Denison et al. |
| 8,912,600 | B2 | 12/2014 | You |
| 9,018,705 | B2 | 4/2015 | Hwang |
| 9,673,084 | B2 | 6/2017 | Liu et al. |
| 10,529,812 | B1 | 1/2020 | Edwards |
| 11,302,687 | B2 | 4/2022 | Zeng et al. |
| 2003/0001206 | A1* | 1/2003 | Negoro ............... H10D 84/856 257/E21.639 |
| 2004/0108549 | A1* | 6/2004 | Denison ............... H10D 62/393 257/E29.066 |

(Continued)

FOREIGN PATENT DOCUMENTS

| EP | 2622638 | 4/2017 |
| TW | I500156 | 9/2015 |
| TW | I563661 | 12/2016 |

OTHER PUBLICATIONS

Cha et al., "0.18μm 100V-rated BCD with Large Area Power LDMOS with ultra-low effective Specific Resistance", IEEE, Proceedings of the 2016 28th International Symposium on Power Semiconductor Devices and ICs {ISPSD), Jun. 12-16, 2016, 4 pages.

(Continued)

*Primary Examiner* — Duy T Nguyen
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to high-voltage electrostatic discharge devices and methods of manufacture. The structure includes: a semiconductor material comprising an emitter region, a base region, and a collector region; a thermally grown insulator region on the semiconductor material which extends over a junction of the base region and the collector region; a first field plate on the thermally grown insulator region, the first field plate being electrically connected to the emitter region; and a second field plate on the thermally grown insulator region, the second field plate being electrically connected to the collector region.

20 Claims, 3 Drawing Sheets

(56) References Cited

U.S. PATENT DOCUMENTS

| | | | |
|---|---|---|---|
| 2005/0253216 A1 | 11/2005 | Tsuchiko | |
| 2009/0072308 A1* | 3/2009 | Chen | H10D 30/0281 |
| | | | 257/E29.256 |
| 2010/0019341 A1* | 1/2010 | Gill | H01L 29/735 |
| | | | 257/E23.002 |
| 2012/0241900 A1 | 9/2012 | Chen et al. | |
| 2014/0042544 A1 | 2/2014 | Karno | |
| 2014/0197491 A1 | 7/2014 | Yamaj | |
| 2014/0225156 A1* | 8/2014 | Zhan | H01L 27/0277 |
| | | | 257/164 |
| 2014/0353799 A1 | 12/2014 | Hwang | |
| 2015/0048451 A1 | 2/2015 | Chan | |
| 2017/0054019 A1 | 2/2017 | Huang | |
| 2018/0211950 A1 | 7/2018 | Chiu et al. | |
| 2018/0286853 A1 | 10/2018 | Mallikarjunaswamy | |
| 2018/0323184 A1 | 11/2018 | Hung et al. | |
| 2019/0103396 A1 | 4/2019 | Zhan et al. | |
| 2019/0103498 A1 | 4/2019 | Pang et al. | |
| 2019/0259829 A1 | 8/2019 | Mun et al. | |
| 2021/0134787 A1* | 5/2021 | Zeng | H01L 27/0259 |
| 2021/0184033 A1 | 6/2021 | Coyne et al. | |
| 2021/0327869 A1 | 10/2021 | Zeng et al. | |
| 2023/0098207 A1 | 3/2023 | Ikeura et al. | |
| 2024/0222478 A1* | 7/2024 | Zhang | H01L 29/1095 |

OTHER PUBLICATIONS

Specification and Drawings filed Jan. 13, 2023 in U.S. Appl. No. 18/096,811, 25 pages.

A. Gendron et al., "Area-Efficient, Reduced and No-Snapback PNP-based ESD Protection in Advanced Smart Power Technology", Electrical Overstress/Electrostatic Discharge Symposium, 2006, IEEE, Abstract, 3 pages.

P. Renaud et al., "High robustness PNP-based structure for the ESD protection of high voltage I/Os in an advanced smart power technology", Bipolar/BiCMOS Circuits and Technology Meeting, 2007, IEEE, Abstract, 3 pages.

R. Zhu et al., "Implementation of High-Side, High-Voltage RESURF LDMOS in a sub-half Micron Smart Power Technology", Proceedings of 2001 International Symposium on Power Semiconductor Devices & ICs, 2001, IEEE, Abstract, 3 pages.

V. Khemka et al., "A Floating RESURF (FRESURF) LD-MOSFET Device Concept", IEEE Electron Device Letters, Oct. 2003, vol. 24, No. 10, IEEE, Abstract, 3 pages.

Specification and Drawings filed Dec. 27, 2023 in U.S. Appl. No. 18/397,008, 27 pages.

Office Action for U.S. Appl. No. 18/643,606 dated Oct. 17, 2024; 21 pages.

Response to Restriction Requirement dated Aug. 30, 2024 in U.S. Appl. No. 18/643,606, 1 page.

Response to Office Action dated Jan. 21, 2025 in U.S. Appl. No. 18/643,606 9 pages.

Response to Non-Final Rejection dated Jan. 8, 2025 in U.S. Appl. No. 18/643,606 11 pages.

* cited by examiner

HIGH-VOLTAGE ELECTROSTATIC DISCHARGE DEVICE

BACKGROUND

The present disclosure relates to semiconductor structures and, more particularly, to high-voltage electrostatic discharge devices and methods of manufacture.

Electrostatic discharge (ESD) is the transfer of electrostatic charge between bodies at different electrostatic potentials (voltages). As is known, an ESD event can destroy and seriously impair IC devices, e.g., circuits used in handheld devices such as cellular telephones. ESD protection devices are often built into IC devices in order to protect the various electronic components with the IC device High frequency circuit applications (e.g., ASIC high speed serial (HSS) links, power amplifiers in wireless communications, etc.) require low-capacitance electrostatic discharge (ESD) protection. For example, a power amplifier in CMOS technologies is susceptible to ESD events, which can damage the integrated circuit (IC), hence requiring ESD protection. Conventional ESD devices using, e.g., ESD diodes, etc., tend to have a high parasitic capacitance which impacts circuitry when the ESD is off, during normal operation.

SUMMARY

In an aspect of the disclosure, a structure comprises: a semiconductor material comprising an emitter region, a base region, and a collector region; a thermally grown insulator region on the semiconductor material which extends over a junction of the base region and the collector region; a first field plate on the thermally grown insulator region, the first field plate being electrically connected to the emitter region; and a second field plate on the thermally grown insulator region, the second field plate being electrically connected to the collector region.

In an aspect of the disclosure, a structure comprises: a semiconductor material comprising an emitter region of a first dopant type, a base region of a second dopant type, and a collector region of the first dopant type; a thermal oxide region in the semiconductor material extending over a junction of the first dopant type and the second dopant type; a first field plate on the thermally grown insulator region and electrically connecting to the emitter region; and a second field plate on the thermally grown insulator region and which spans over the junction of the first dopant type and the second dopant type.

In an aspect of the disclosure, a method comprises: forming a semiconductor material comprising an emitter region, a base region, and a collector region; forming a thermally grown insulator region on the semiconductor material which extends over a junction of the base region and the collector region; forming a first field plate on the thermally grown insulator region, the first field plate being electrically connected to the emitter region; and forming a second field plate on the thermally grown insulator region, the second field plate being electrically connected to the collector region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high-voltage electrostatic discharge devices and methods of manufacture. More specifically, the high-voltage electrostatic discharge (HV-ESD) devices include polysilicon field plates on a thermally grown oxide (e.g., LOCOS). In addition, drift regions of different dopant types are abutting one another, with the thermally grown oxide extending over the junction of the abutting drift regions, e.g., PN junction. Advantageously, the HV-ESD device exhibits stable DC leakage current due to a clean semiconductor interface with the LOCOS. Moreover, the HV-ESD device exhibits an increase ESD performance compared to conventional PNP or diode structures. For example, in embodiments, the LOCOS can help reduce the turn-on resistance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
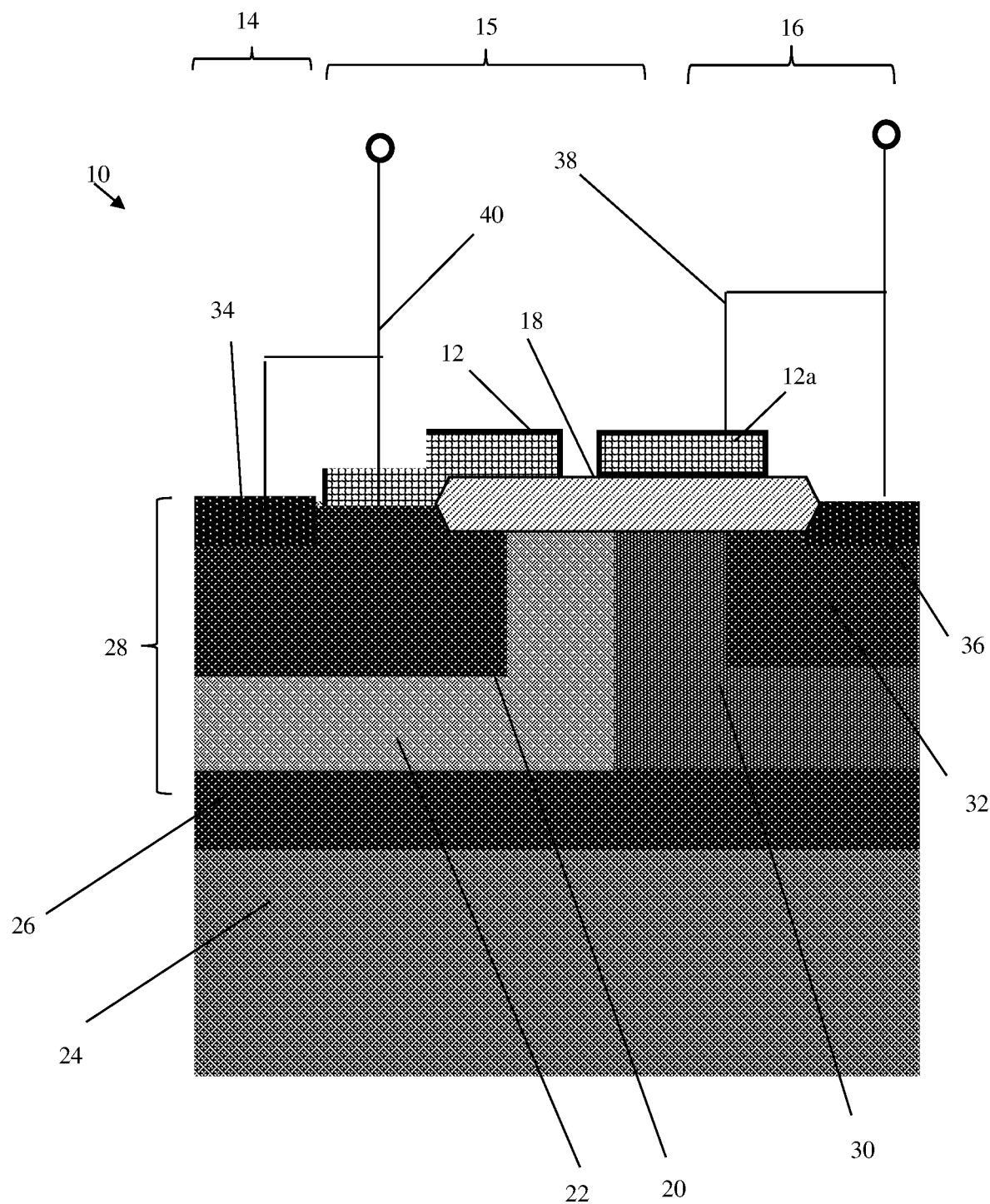
FIG. 1 shows a high-voltage electrostatic discharge device and methods of manufacture in accordance with aspects of the present disclosure.

FIG. 1 shows a high-voltage electrostatic discharge (HV-ESD) device and methods of manufacture in accordance with aspects of the present disclosure. In embodiments, the HV-ESD device 10 incudes field plates 12, 12a connected to an emitter region 14, e.g., P+ contact 34, and a collector region 16, e.g., P+ contact 36, respectively. In embodiments, the field plates 12, 12a may be polysilicon material which sit on a thermally grown oxide 18, e.g., LOCOS. The thermally grown oxide 18 may extend over a junction of the base region 15 and the collector region 16.

In more specific embodiments, the thermally grown oxide 18 may extend over doped regions 20, 22 (e.g., N+ doped regions) of the base region 15 and doped regions 30, 32 in the collector region 16. The field plate 12 may extend on a surface of the thermally grown oxide 18 and the doped region 20 (e.g., N-well). The field plate 12 may also be adjacent to the P+ contact 34. The field plate 12a may extend on a surface of the thermally grown oxide 18 and is situated over a junction of the p-doped region 30 of the collector region 16 and the n-doped region 22 of the bae region 15.

FIG. 1 further shows a semiconductor substrate 24. The semiconductor substrate 24 may comprise an n-type semiconductor substrate as is known in the art. For example, the semiconductor substrate 24 may be an epitaxially grown semiconductor material composed of any suitable material including, but not limited to, Si, SiGe, SiGeC, SiC, GaAs, InAs, InP, and other III/V or II/VI compound semiconductors. In preferred embodiments, the semiconductor substrate 24 may comprise any suitable single crystallographic orientation (e.g., a <100>, <110>, <111>, or <001> crystallographic orientation).

A buried isolation structure 26 may be provided in the semiconductor substrate 24. In embodiments, the buried isolation structure 26 may be a buried P+ semiconductor layer formed by an ion implantation process as is known in the art. For example, the buried isolation structure 26 may be formed by introducing a p-type dopant by, for example, ion implantation processes in the semiconductor substrate 24. The p-type dopant may be, e.g., Boron, among other suitable examples.

Still referring to FIG. 1, a semiconductor material 28 may be provided over the buried isolation structure 26. In embodiments, the semiconductor material 28 may be epitaxial grown semiconductor material with, for example, an in-situ n-type dopant, e.g., Arsenic. In embodiments, the semiconductor material 28 may be composed of the same semiconductor material as the semiconductor substrate 24.

Examples of various epitaxial growth process processes that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from about 300° C. to 800° C. The epitaxial growth can be performed utilizing any well-known precursor gas or gas mixture. Carrier gases like hydrogen, nitrogen, helium and argon can be used. An n-type dopant is typically added to the precursor gas or gas mixture.

FIG. 1 further shows the doped regions 20, 22. In embodiments, the doped regions 20, 22 may form part of the base region 15 and may be composed of n-type dopants. The doped regions 20, 22 may be formed by an ion implantation process with n-type dopants, e.g., Arsenic. In embodiments, the doped region 22 may be an N-drift region which extends to and contacts the buried P+ semiconductor layer 26; whereas the doped region 20 may be an N-well in the N-drift region 22. A P+ contact 34 may be provided within the N-well 22, adjacent to the field plate 12.

In embodiments, the field plate 12 may contact the P+ contact 34. Also, in this embodiment, the field plate 12 extends over an upper surface of the thermally grown oxide 18, the N-well 22 and the drift region 20.

FIG. 1 further shows the collector region 16 comprising the doped regions 30, 32. In embodiments, the collector region 16 may also comprise the buried P+ semiconductor layer 26 and the P+ contact 36. The doped region 32 may be a p-type doped region (e.g., P-well) and the doped region 30 may be a deep p-type doped region. For example, the deep p-type doped region 30 may be a high-voltage deep P-well within the semiconductor material 28. The deep P-type doped region 30 may act as a drift region, which abuts to and directly contacts the N-drift region 22. The thermally grown oxide 18 bridges the junction between the deep p-type doped region 30 and the N-drift region 22, e.g., extends of a PN junction. Also, the field plate 12a bridges the junction between the deep p-type doped region 30 and N-drift region 22. In embodiments, the field plate 12a may also extend over the p-type doped region 32.

A P+ contact 36 sits within the p-type doped region 32 (e.g., P-well). In embodiments, the P+ contact 36 electrically connects to the collector region 16. For example, a wiring structure 38 connects the field plate 12a to the P+ contact 36. Similarly, a wiring structure 40 connects the P+ contact 34 (in the emitter region 14) to the field plate 12. The field plate 12 connected to emitter region, e.g., P+ contact 34, makes the breakdown voltage walk out after about 100V long-time DC stress.

FIG. 1 further shows the thermally grown oxide 18, e.g., LOCOS, extending between the emitter region 14 and the collector region 16. In embodiments, the thermally grown oxide 18 sits over the N-drift region 22, N-well 20, the deep p-type doped region 30 and the p-well 32. In addition, the thermally grown oxide 18 may extend partially within these doped regions 20, 22, 30, 32 and above a top surface of the doped regions 20, 22, 30, 32. In embodiments, the thermally grown oxide 18 may have a uniform thickness. The thermally grown oxide 18 will prevent leakage issues due to a better quality oxide, in addition to pushing the current deeper into the semiconductor material 28.

As should be understood by those of skill in the art, LOCOS is a local oxidation of semiconductor material, e.g., Si. In the fabrication process, for example, $SiO_2$ is formed in selected areas on a semiconductor wafer having, for example, the Si—$SiO_2$ interface at a lower point than the rest of the silicon surface. In the thermal oxidation process, a thin layer of oxide (usually silicon dioxide) is provided on the surface of the semiconductor substrate. The process forces an oxidizing agent to diffuse into the semiconductor substrate at high temperature thus causing a reaction. Thermal oxidation may be applied to different materials, but most commonly involves the oxidation of silicon substrates to produce silicon dioxide.

In embodiments, the doped regions 20, 22, 26, 30, 32, 34, 36 may be formed by ion implantation processes. By way of example, respective patterned implantation masks may be used to define selected areas exposed for the implantations. The implantation mask used to select the exposed area for forming the doped regions 20, 22 is stripped after implantation, and before the implantation mask used to form the p-doped regions 26, 30, 32, 34, 36 (or vice versa). The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The n-typed doped regions 20, 22 may be formed using n-type dopants; whereas the p-doped regions 26, 30, 32, 34, 36 may be formed using p-type dopants. The p-type dopants may be, e.g., Boron (B), and the n-type dopants may be, e.g., Arsenic (As), Phosphorus (P) and Antimony (Sb), among other suitable examples.

Moreover, a silicide contact may be formed on the P+ contacts 34, 36, prior to forming the wiring structures 38, 40. As should be understood by those of skill in the art, the silicide process begins with deposition of a thin transition metal layer, e.g., nickel, cobalt or titanium, over fully formed and patterned semiconductor devices (e.g., contacts 34, 36). After deposition of the material, the structure is heated allowing the transition metal to react with exposed silicon (or other semiconductor material as described herein)

in the active regions of the semiconductor device (e.g., contacts 34, 36) forming a low-resistance transition metal silicide. Following the reaction, any remaining transition metal is removed by chemical etching, leaving silicide contacts.

Figure 2:
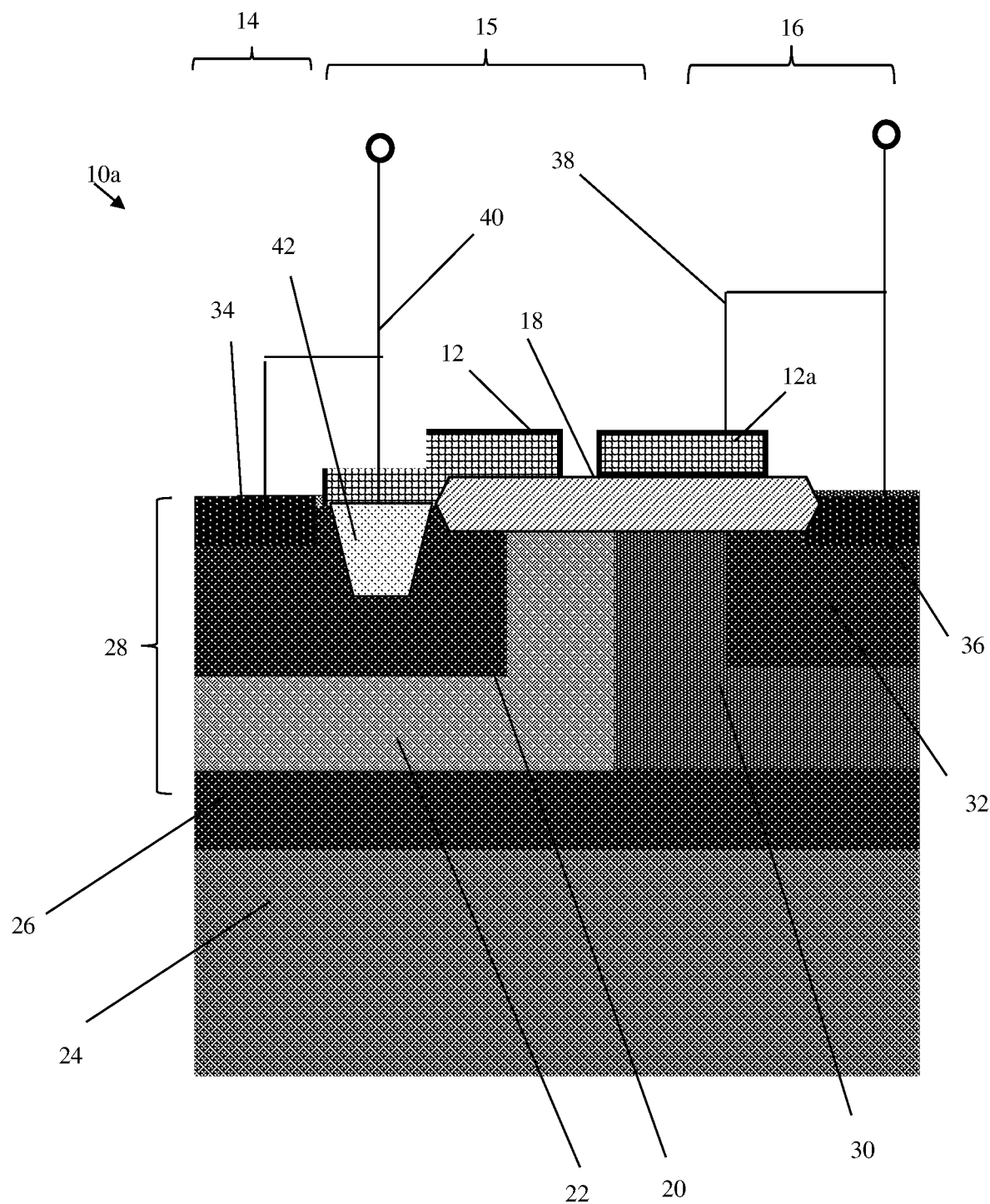
FIG. 2 shows a high-voltage electrostatic discharge device and methods of manufacture in accordance with additional aspects of the present disclosure.

FIG. 2 shows a high-voltage electrostatic discharge device in accordance with additional aspects of the present disclosure. In the structure 10a of FIG. 2, a shallow trench isolation structure 42 may be formed in the N-well 20, under the field plate 12. In this way, the field plate 12 extends over a surface of the thermally grown oxide 18 and the shallow trench isolation structure 42. The shallow trench isolation structure 42 will provide additional isolation between the P+ contact 34 (e.g., emitter) and the base region 15, pushing current deeper into the N-well 20. The remaining features of the device 10b are similar in structure and function to the device 10 shown in FIG. 1.

In embodiments, the shallow trench isolation structure 42 may be formed by conventional lithography, etching and deposition methods known to those of skill in the art. For example, a resist formed over the semiconductor material 28 is exposed to energy (light) and developed utilizing a conventional resist developer to form a pattern (opening). An etching process with a selective chemistry, e.g., reactive ion etching (RIE), will be used to transfer the pattern from the patterned photoresist form a trench in the semiconductor material 28 through the openings of the resist. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the semiconductor material 28 can be removed by conventional chemical mechanical polishing (CMP) processes.

Figure 3:
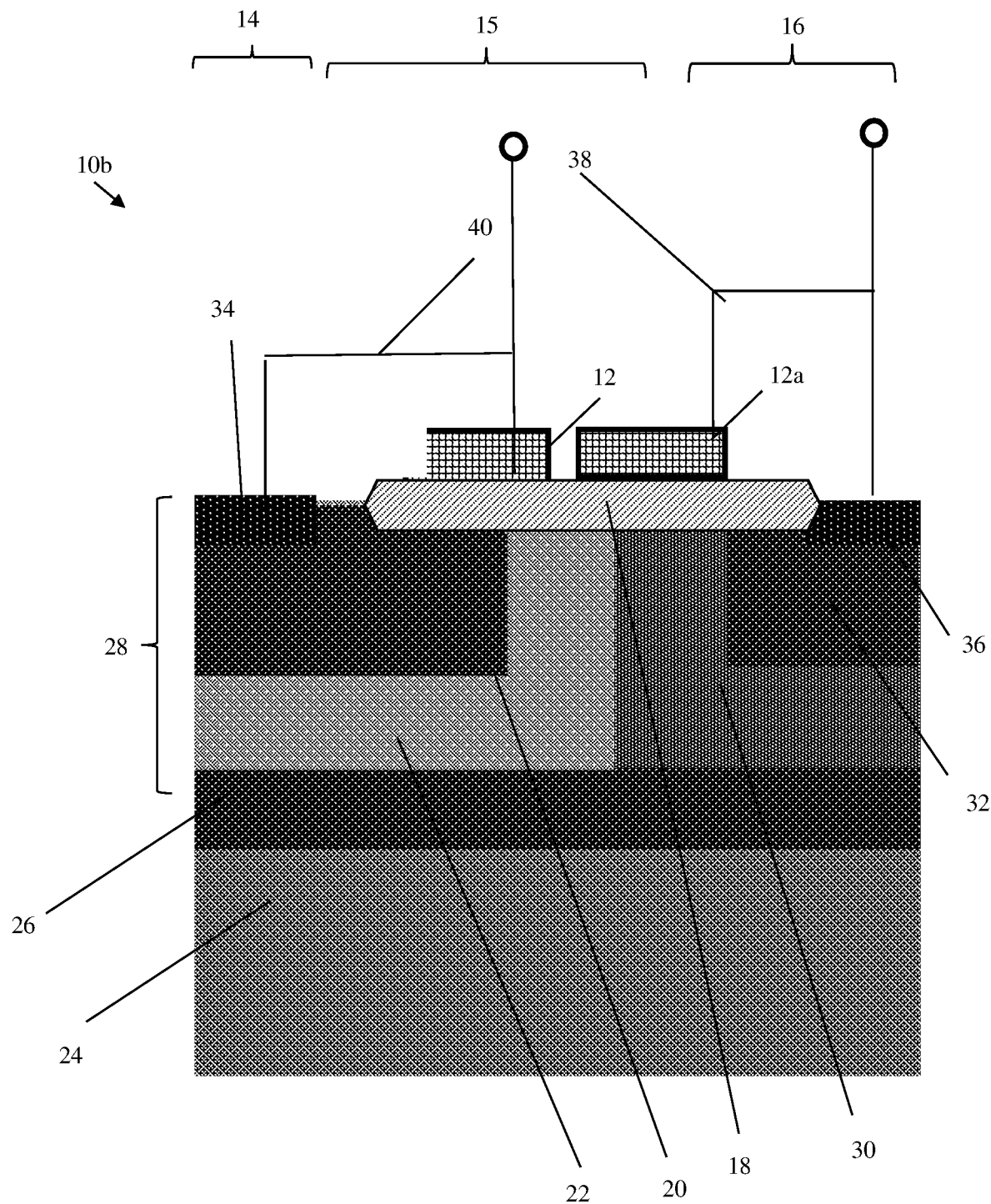
FIG. 3 shows a high-voltage electrostatic discharge device in accordance with further aspects of the present disclosure.

FIG. 3 shows a high-voltage electrostatic discharge device in accordance with additional aspects of the present disclosure. In the device 10b of FIG. 3, the field plate 12 is formed only over the thermally grown oxide 16. In this way, the field plate 12 does not contact the P+ contact 34 in the emitter region 14 or the N-well 20 in the base region 15. The remaining features of the device 10b are similar in structure and function to the device 10 shown in FIG. 1.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor material comprising an emitter region, a base region, and a collector region;
   a thermally grown insulator region on the semiconductor material which extends over a junction of the base region and the collector region;
   a first well of a first dopant type shared with the base region and the emitter region;
   a second well of a second dopant type shared with the base region and the collector region, the second well abutting the first well;
   a first field plate on the thermally grown insulator region and extending onto the first well shared between the emitter region and the base region, the first field plate being electrically connected to a contact in a portion of the first well extending within the emitter region by a wiring structure extending from the first field plate to the contact in the emitter region; and
   a second field plate on the thermally grown insulator region, the second field plate being electrically connected to the collector region.

2. The structure of claim 1, wherein the first field plate and the second field plate comprise polysilicon material.

3. The structure of claim 1, wherein the second field plate extends over a junction of doped regions of the collector region and the base region.

4. The structure of claim 3, wherein doped regions comprise an n-type doped region contacting a p-type doped region.

5. The structure of claim 4, further comprising a p-type buried isolation structure below the n-type doped region and the p-type doped region.

6. The structure of claim 5, wherein the collector region comprises the p-type buried isolation structure, the p-type doped region and a p-well in the p-type doped region, and the second field plate electrically connects to a P+ contact in the p-well.

7. The structure of claim 1, wherein the base region comprises an N-type drift region and an N-well within the drift region, and the emitter region comprises a P+ contact within the N-well.

8. The structure of claim 7, wherein the first field plate extends on the N-well and adjacent to the P+ contact.

9. The structure of claim 1, wherein the first field plate extends over a shallow trench isolation structure.

10. The structure of claim 9, wherein the shallow trench isolation structure is between the thermally grown insulator region and a P+ contact for the emitter region.

11. The structure of claim 1, wherein the first field plate is on the thermally grown insulator region, adjacent to and remote from an N-drift region of the base region.

12. The structure of claim 1, wherein the thermally grown insulator region comprises a local oxidation of the semiconductor material which extends above a top surface of the semiconductor material.

13. A structure comprising:
   a semiconductor material comprising an emitter region of a first dopant type, a base region comprising a junction of the first dopant type abutting a second dopant type, and a collector region of the second dopant type;
   a thermal oxide region in the semiconductor material extending over the junction of the first dopant type and the second dopant type;
   a first field plate on the thermal oxide region and electrically connecting to the emitter region by a wiring structure extending from the first field plate to a contact in a well of the first dopant type of the emitter region, the first field plate additional-extending onto the first dopant type within the semiconductor material; and
   a second field plate on the thermal oxide region and which spans over the junction of the first dopant type and the second dopant type.

14. The structure of claim 13, wherein the first field plate extends adjacent to a contact of the emitter region.

15. The structure of claim 13, wherein the first field plate is on the thermal oxide region, adjacent to and remote from a drift region of the base region.

16. The structure of claim 13, wherein the first field plate and the second field plate comprise polysilicon material.

17. The structure of claim 13, wherein the second field plate extends over a PN junction of the base region and the collector region.

18. The structure of claim 17, wherein the thermal oxide region extends over the PN junction of the base region and the collector region.

19. The structure of claim 18, wherein the PN junction comprises an N-drift region contacting a P-drift region.

20. A method comprising:
   forming a semiconductor material comprising an emitter region, a base region, and a collector region;
   forming a thermally grown insulator region on the semiconductor material which extends over a junction of the base region and the collector region;
   forming a first well of a first dopant type shared with the base region and the emitter region;
   forming a second well of a second dopant type shared with the base region and the collector region, the second well abutting the first well;
   forming a first field plate on the thermally grown insulator region and extending onto the first well shared between the emitter region and the base region, the first field plate being electrically connected to a contact in a portion of the first well extending within the emitter region by a wiring structure extending from the first field plate to the contact in the emitter region; and
   forming a second field plate on the thermally grown insulator region, the second field plate being electrically connected to the collector region.

* * * * *